United States Patent [19]
Chevallet et al.

[11] Patent Number: 5,973,261
[45] Date of Patent: Oct. 26, 1999

[54] HEAT EXCHANGER FOR ELECTRONIC COMPONENTS AND ELECTROTECHNICAL EQUIPMENT

[75] Inventors: Jean-Luc Chevallet, L'Ile d'Abeau; Ivan Rubichon, Saint Marcelin; Gérard Marichy, Sainte Foy les Lyon, all of France

[73] Assignee: FERRAZ a French Societe Anonyme, Lyons, France

[21] Appl. No.: 09/015,756

[22] Filed: Jan. 29, 1998

[30] Foreign Application Priority Data

Feb. 3, 1997 [FR] France .................................. 97 01384

[51] Int. Cl.[6] ..................................................... H05K 5/00
[52] U.S. Cl. .................................. 174/17 VA; 174/17 LF; 174/50
[58] Field of Search ......................... 174/17 VA, 17 LF, 174/50

[56] References Cited

U.S. PATENT DOCUMENTS

| | | |
|---|---|---|
| 3,724,706 | 4/1973 | Slocum .................................. 174/50 X |
| 3,793,603 | 2/1974 | Fontaine . |
| 4,005,341 | 1/1977 | Uptegraff, Jr. et al. ........ 174/17 VA X |
| 4,366,497 | 12/1982 | Block et al. . |
| 5,221,575 | 6/1993 | Nakano et al. . |
| 5,334,799 | 8/1994 | Naito et al. ......................... 174/17 VA |
| 5,423,376 | 6/1995 | Julien et al. . |
| 5,621,189 | 4/1997 | Dodds ..................................... 174/50 |
| 5,786,980 | 7/1998 | Evans .............................. 174/17 LF X |

FOREIGN PATENT DOCUMENTS

| | | |
|---|---|---|
| 0006241 | 6/1979 | European Pat. Off. . |
| 0021269 | 6/1980 | European Pat. Off. . |
| 0611235 | 2/1994 | European Pat. Off. . |

*Primary Examiner*—Dean A. Reichard
*Attorney, Agent, or Firm*—Dowell & Dowell, P.C.

[57] ABSTRACT

This invention relates to a heat exchanger for electronic components and electrotechnical equipment, comprising a box defining an interior space through which a heat-transfer fluid passes, at least one face of said box oriented towards said components or equipment being covered with an electrically insulating plate, characterized in that said box and said plate are overmoulded with a covering of electrically insulating material and in that a spacer for expansion is disposed between said box and said insulating plate.

11 Claims, 2 Drawing Sheets

HEAT EXCHANGER FOR ELECTRONIC COMPONENTS AND ELECTROTECHNICAL EQUIPMENT

FIELD OF THE INVENTION

The invention relates to a heat exchanger for electronic components and electrotechnical equipment. Exchangers of this type may be used in power assemblies to cool the components thanks to the circulation of a fluid such as water.

BACKGROUND OF THE INVENTION

Due to their functioning, electrical or electronic components may be taken to a potential substantially different from that of earth, of the order of several kilovolts, while the heat exchangers which are metallic must remain at earth potential, in particular since they contain a conducting liquid which must be at that potential. In fact, the tubes for circulation of the cooling fluid may be touched by an operator, with the result that it is imperative that they are not at high voltage. Moreover, this liquid circulates between components which may be at different electric potentials.

In order to electrically insulate a heat exchanger from an electrical component taken to high voltage, it is know to insert between these two elements an insulating plate made of ceramics, for example alumina or aluminum nitride. The shape of this plate is adapted to the surface of the exchanger opposite the components. In order to avoid a tracking current, resulting from the high voltage, from the component towards the heat exchanger, it is most often chosen to use an insulating plate whose dimensions are substantially larger than those of the component and of the exchanger in order to prolong the tracking as much as possible. This increases the transverse dimensions of the exchanger. Moreover, the use of such a plate requires precise operations when it is positioned, which renders more complex the installation of systems incorporating such heat exchangers. In addition, these insulating plates are fragile and may break when they are positioned or when a system composed of a plurality of components and a plurality of heat exchangers arranged in alternation, are placed under pressure.

It might be envisaged to cover a heat exchanger of the type mentioned above with an electrically insulating covering so as to avoid the tracking of the electricity as much as possible. In that case, and as is shown in FIG. 5 of the accompanying drawings, the central box 105 of a heat exchanger 101 and an electrically insulating plate 106 are covered, for example by overmoulding, with a covering 102. Now, these elements are capable of functioning in a relatively broad temperature range, as the temperature of the water used for cooling may evolve between 5 and about 100° C. while this element is subjected to a pressure which may attain 5 tons to the square decimeter. The heat exchanger is conventionally made of metal, while the electrically insulating layer is made of a non-metallic insulating material. The exchanger and the plate therefore present substantially different coefficients of expansion, with the result that, due to the variations of the temperatures to which they are subjected, their dimensional variations are substantially different.

Now, in the case shown in FIG. 5, no sliding would be admissible as the zone of contact 120 between the box 105 and, on the one hand, the plate 106, on the other hand, the covering 102, would constitute a succession of points of anchoring or adherence of the two elements 105 and 106 in the covering 102. Taking into account the differential expansions obtained, cracks would therefore be obtained in the most fragile material, i.e. in the electrically insulating plate. Such cracks would serve for electrical tracking, with the result that the plate would no longer be in a position effectively to fulfill its role of insulation. Up to the present time, one has therefore been dissuaded from making a heat exchanger of the type in question, embedded in a covering of electrically insulating material. One must therefore be content with the systems incorporating an added insulating plate, with the drawbacks set forth.

It is an object of the present invention to overcome these drawbacks by proposing a heat exchanger capable of functioning in a broad temperature range, despite the differential expansions obtained in the different materials, while being electrically insulated with respect to the electrical materials which surround it.

SUMMARY OF THE INVENTION

To that end, the invention relates to a heat exchanger for electronic components and electrotechnical equipment, comprising a box defining an interior space through which a heat-transfer fluid passes, at least one face of said box oriented towards said components or equipment being covered with an electrically insulating plate, characterized in that said box and said plate are overmoulded with a covering of electrically insulating material and in that a spacer for expansion is disposed between said box and said insulating plate.

Thanks to the invention, the differential expansions inherent in the use of the heat exchanger do not lead to the destruction of the latter, in particular of the electrically insulating plate, as the expansion spacer allows a relative displacement of the insulating plate with respect to the box of the heater.

According to one embodiment of the invention, a protecting shield is placed on the outer face of the insulating plate, an expansion spacer being disposed between the shield and the plate. As indicated hereinabove, the spacer makes it possible to compensate the differential expansions existing between the shield which, in practice, is made of metal, and the insulating plate which is not according According to a particularly advantageous aspect of the invention, and whatever the embodiment chosen, the peripheral edge of the spacer is recessed with respect to the corresponding peripheral edge of the insulating plate, of the box or of the shield. This construction makes it possible to protect the spacer by the insulating plate or the shield. This also enables the tracking of the electrostatic charges around the insulating plate to be prolonged.

In this case and in accordance with another advantageous aspect of the invention, it may be provided that the free space formed in the vicinity of the peripheral edge of the spacer between the insulating plate and the box or between the insulating plate and the protecting shield, is overall filled with the electrically insulating material forming the covering. Such filling of the space left free by the expansion spacer allows the insulating material to absorb the dimensional variations by being deformed thanks to its natural elasticity.

According to a particularly advantageous construction, the insulating covering comprises tongues penetrating between said plate and said box or said shield up to the vicinity of the peripheral edge of said expansion spacer. These tongues prolong the tracking of the high voltage.

Depending on the choice of embodiment, it may be provided that the expansion spacer is composed of a metal foil, by metallization of the insulating plate or by slip coating, i.e. dense suspension of a refractory or metal powder in a binding agent, particularly suspension of carbon powder in an organic resin. The spacer may also be made of a supple graphite foil. In the latter case, this foil may present a thickness included between 0 and 1 mm, preferably between 0.2 and 0.5 mm. Other materials may be adopted for manufacturing the expansion spacer as long as the combination of their physical characteristics, such as their modulus of longitudinal elasticity, their coefficient of thermal expansion, their coefficient of friction with respect to the insulating plate and their heat conductivity, are compatible with the objective set forth. Furthermore, the thickness of the spacer is chosen as a function of these characteristics.

Whatever the embodiment chosen, the covering of electrically insulating material may include gussets disposed around the admission and outlet pipes of the exchanger. The function of such gussets is to prolong the tracking of the electrical charges.

BRIEF DESCRIPTION OF THE DRAWINGS

The invention will be more readily understood on reading the following description of two embodiments of a heat exchanger in accordance with the principle thereof, given solely by way of example and with reference to the accompanying drawings, in which.

DESCRIPTION OF PREFERRED EMBODIMENTS

Figure 1:
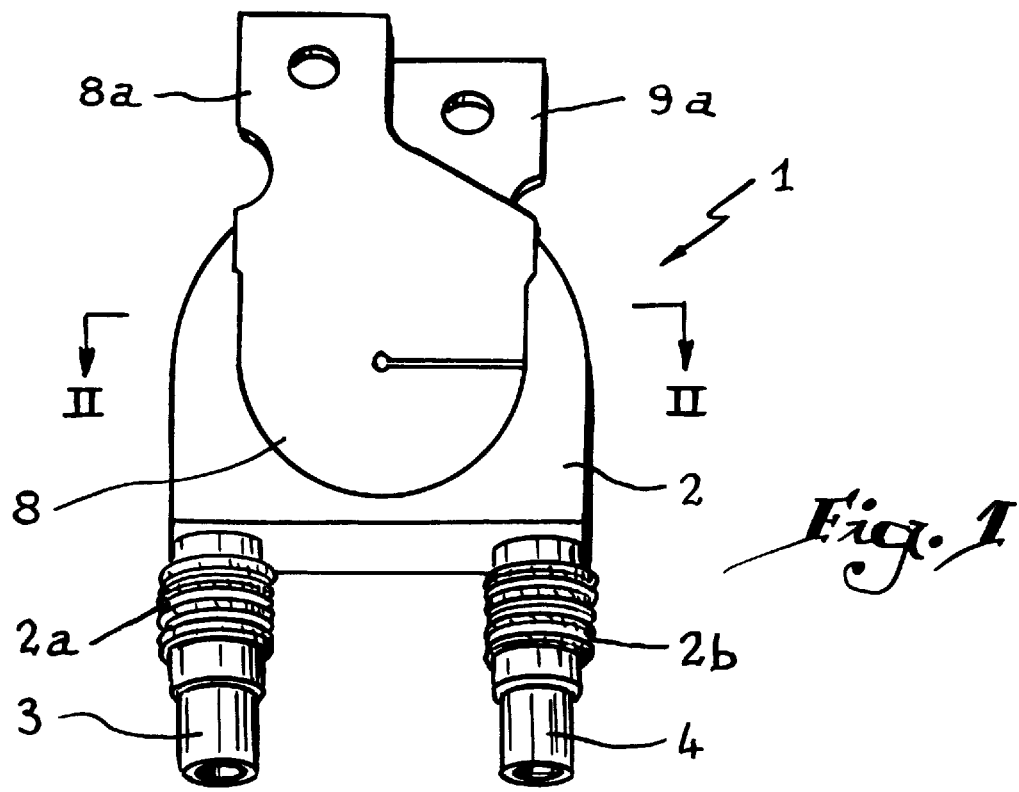
FIG. 1 is a view in perspective of a heat exchanger according to the invention.

Referring now to the drawings, FIG. 1 shows a heat exchanger 1, provided with a covering 2 made of electrically insulating material such as in particular a natural elastomer or based on silicon, resin or any other material presenting suitable insulating properties. Two metal tubes 3 and 4 serve for supplying and evacuating a heat-transfer fluid in the exchanger. The covering 2 comprises gussets 2a and 2b disposed around the tubes 3 and 4 which are at earth potential. The function of these gussets is to prolong the tracking of the electrical charges between the surfaces of the exchanger intended to be in contact with electronic components or electrotechnical equipment and the tubes 3 and 4.

Figure 2:
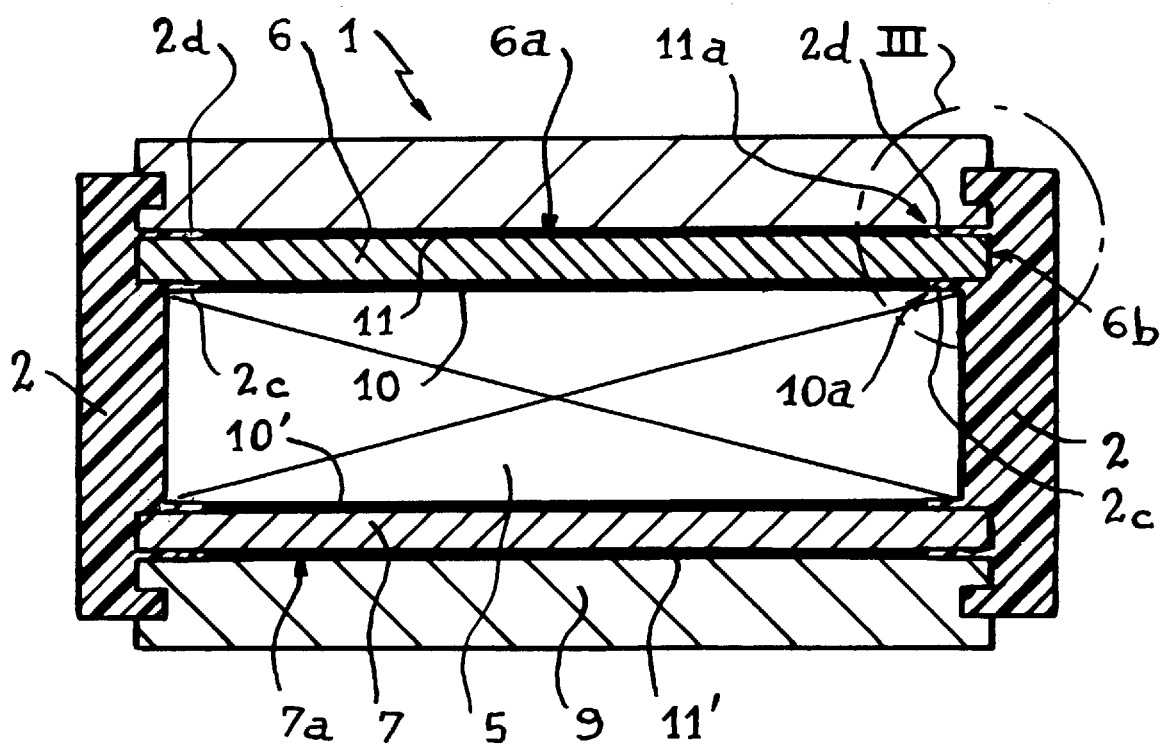
FIG. 2 is a section on a larger scale along line II—II of FIG. 1.

As is more clearly apparent in FIG. 2, the central box 5 of the heat exchanger, which may be made of aluminum and in accordance with the technical teaching of EP-A-0 611 235, is overmoulded with the covering 2, with two plates 6 and 7 for electrical insulation and two shields 8 and 9 ensuring mechanical protection of the plates 6 and 7 and the heat conduction between the box 5 and the adjacent electrical components, as well as, in certain cases, an electrical connection with a source of potential. The shields 8 and 9 are placed in the vicinity of the outer face 6a or 7a of the plates 6 and 7 and bear extensions 8a and 9a allowing them to be connected on a holding bar or connected electrically. In this way, the exchanger 1 constitutes a one-piece assembly which may be manipulated simply and where there is no risk of its insulating plates 6 and 7 being damaged during manipulation. Plates 6 and 7 may be made of alumina ($Al_2O_3$), aluminum nitride or any other suitable ceramics.

Figure 3:
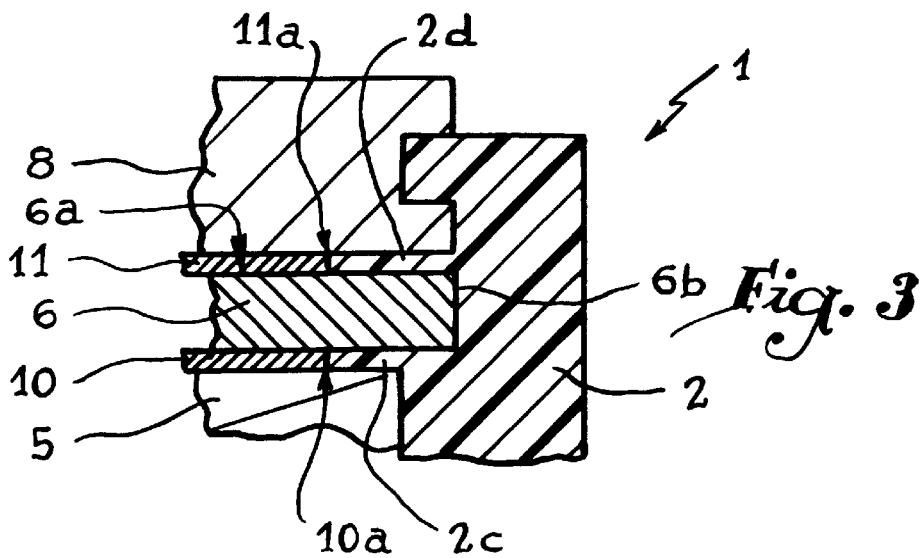
FIG. 3 is a view in detail, on a larger scale, of the zone indicated III in FIG. 2.

As is more clearly visible in FIG. 3, a spacer for expansion 10 is disposed between the box 5 and the plate 6, while a similar spacer for expansion 11 is disposed between plate 6 and shield 8. Identical spacers 10' and 11' are disposed on either side of plate 7.

The spacers 10 and 11 are made from a supple graphite foil marketed by CARBONE LORRAINE under the Registered Trademark PAPYEX™. The spacers 10 and 11 present a thickness included between 0.1 and 1 mm. In practice, a thickness of between 0.2 and 0.5 mm is sufficient to perform the desired function. The supple character of the graphite used for the spacers 10 and 11 advantageously enables it to compensate slight variations in dimensions or surface irregularities of the exchanger I with no risk of their damaging the plate 6.

Figure 5:
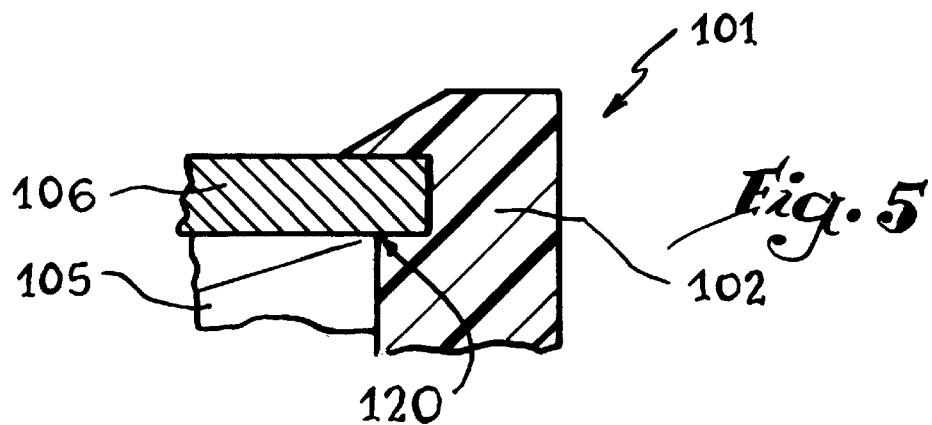
FIG. 5 is a view similar to FIG. 3 for a heat exchanger not incorporating the present invention.

The supple graphite has a low coefficient of friction with the metal of the box 5 and with the alumina of the plate 6, with the result that a relative slide of these two elements is possible, in particular due to the differential expansions obtained in the case of substantial increase in the temperature of the exchanger 1 assembly. It is noted that there is no zone of adherence, such as zone 120 shown in FIG. 5, as the box 5 and the plate 6 are not in direct contact.

In the same way, the spacer 11 allows a relative displacement of the plate 6 and shield 8.

The peripheral edge 10a of spacer 10 and the peripheral edge 11a of spacer 11 are recessed within the volume occupied by spacers 10 and 11 on either side of the plate 6. In other words, and as shown in FIG. 3, these edges 10a and 11a are recessed with respect to the corresponding edges of the box 5, of the plate 6 and of the shield 8. Two tongues 2c and 2d of insulating material thus penetrate, during overmoulding, inside the space left free by the spacers 10 and 1 1 in the vicinity of the peripheral edge 6b of the plate 6 up to the proximity of the edges 10a and 11a of the spacers 10 and 11. These tongues 2c and 2d prolong the tracking of the electricity in the vicinity of the plate 6, with the result that the latter is efficient even if its diameter is not substantially greater than that of the box 5 and of the shield 8. This gain results from the good adherence of the material constituting the covering 2 on the insulating plate 6 up to the immediate vicinity of the spacers 10 and 11, which makes it possible to limit the circulation of the electrical charges on the surface of the plate 6 and to reinforce its efficiency. This enables the transverse dimensions of the exchanger of the invention, and therefore its dimensions, to be reduced.

Figure 4:
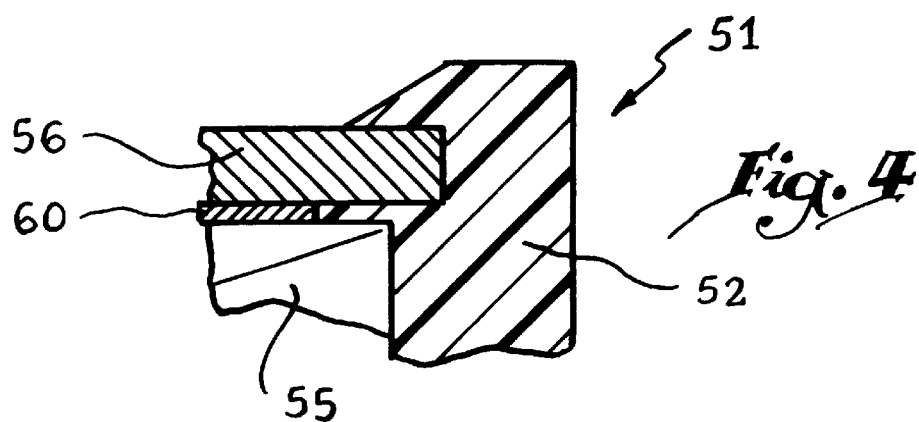
FIG. 4 is a view similar to FIG. 3 for a heat exchanger in accordance with a second embodiment of the invention.

In the second embodiment of the invention shown in FIG. 4, the elements similar to those of the embodiment of FIGS. 1 and 3 bear identical references increased by 50. The exchanger 51 of this embodiment essentially differs from the preceding one in that it does not comprise a protecting shield. In this case, the insulating plate 56 and the box 55 of the exchanger are overmoulded with a covering 52 formed, for example, of polymerized resin. A spacer 60 for expansion is disposed between the plate 56 and the box 55 and allows a transverse displacement of these elements as a function of the differential expansions resulting from thermal stresses. The spacer 60 is made of aluminum and presents a thickness of between 0.1 and 1 mm, preferably between 0.1 and 0.5 mm.

The spacer 60 might also be made of other materials, chosen in particular as a function of their coefficient of friction with the box 55 and the plate 56. By way of example, copper, silver, gold, alumina or carbon fibers may be used.

This embodiment of the invention presents the advantage over the preceding one, of being easier to employ, insofar as only one joint must be disposed on either side of the box 55, promoting the heat exchanges between the box 55 and the components on which it is joined. However, particular precautions must be taken in order not to damage the plate 56 which is exposed during manipulations.

According to other variant embodiments of the invention which have not been illustrated, the spacer for expansion may be produced by metallization of the insulating plate 6 or 56. It is also conceivable to dispose between elements 5 and 6, 6 and 8 or 55 and 56, a joint made from a liquid metal such as in particular marketed under the Registered Trademark CRAYOFOL™.

Whatever the embodiment chosen, the heat exchanger obtained is efficiently protected against current trackings while it is adapted to withstand considerable variations in temperature.

The invention has been shown with a box of overall cylindrical shape, of circular section, but it is applicable whatever the shape of this box.

What is claimed is:

1. Heat exchanger for electronic components and electrotechnical equipment, comprising a box defining an interior space through which a heat-transfer fluid passes, at least one face of said box oriented towards said components and equipment being covered with an electrically insulating plate, wherein said box and said plate are overmoulded with a covering of electrically insulating material and a spacer for expansion is disposed between said box and said insulating plate.

2. The heat exchanger of claim 1, wherein a protecting shield is placed on an outer face of said insulating plate, a spacer for expansion being disposed between said shield and said plate.

3. The heat exchanger of claim 1, wherein a peripheral edge of said spacer is recessed with respect to the corresponding peripheral edge of said insulating plate, of said box or of said shield.

4. The heat exchanger of claim 3, wherein a free space formed in the vicinity of said peripheral edge of said spacer between said insulating plate and said box or between said insulating plate and said shield, is overall filled with electrically insulating material forming said covering.

5. The heat exchanger of claim 4, wherein said insulating covering comprises tongues penetrating between the plate and said box or said shield up to the vicinity of the peripheral edge of said spacer for expansion.

6. The heat exchanger of claim 1, wherein said spacer for expansion is made of a metal foil.

7. The heat exchanger of claim 1, wherein said spacer for expansion is made by metallization of said insulating plate.

8. The heat exchanger of claim 1, wherein said spacer for expansion is composed of a supple graphite foil.

9. The heat exchanger of claim 8, wherein said supple graphite foil has a thickness of between 0.1 and 1 mm.

10. The heat exchanger of claim 1, wherein said covering of electrically insulating material comprises gussets disposed around admission and outlet tubes of said exchanger.

11. The heat exchanger of claim 8, wherein said supple graphite foil has a thickness of between 0.2 and 0.5 mm.

* * * * *